United States Patent
Kim (10) Patent No.: US 10,955,480 B2
(45) Date of Patent: Mar. 23, 2021

(54) VOLTAGE MEASURING DEVICE FOR BATTERY CELL OF VEHICLE

(71) Applicant: KYUNGSHIN CO., LTD., Incheon (KR)

(72) Inventor: Jung Eon Kim, Ansan-si (KR)

(73) Assignee: KYUNGSHIN CO., LTD., Incheon (KR)

( * ) Notice: Subject to any disclaimer, the term of this patent is extended or adjusted under 35 U.S.C. 154(b) by 19 days.

(21) Appl. No.: 16/386,416

(22) Filed: Apr. 17, 2019

(65) Prior Publication Data
US 2019/0324087 A1 Oct. 24, 2019

(30) Foreign Application Priority Data
Apr. 24, 2018 (KR) .................. 10-2018-0047593

(51) Int. Cl.
*G01R 31/364* (2019.01)
*G01R 31/3835* (2019.01)
*G01R 31/00* (2006.01)

(52) U.S. Cl.
CPC ......... *G01R 31/364* (2019.01); *G01R 31/005* (2013.01); *G01R 31/3835* (2019.01)

(58) Field of Classification Search
CPC ............... G01R 31/005; G01R 31/396; H01M 10/4285
See application file for complete search history.

(56) References Cited

U.S. PATENT DOCUMENTS

| | | | |
|---|---|---|---|
| 2011/0059342 A1* | 3/2011 | Lee | H01M 10/482 429/93 |
| 2013/0209847 A1* | 8/2013 | Lev | H01M 10/6554 429/90 |
| 2013/0307479 A1* | 11/2013 | Kim | H02J 7/0022 320/112 |

(Continued)

FOREIGN PATENT DOCUMENTS

| | | |
|---|---|---|
| KR | 1020100109857 A | 10/2010 |
| KR | 101186628 B1 | 9/2012 |
| KR | 101829350 B1 | 2/2018 |

OTHER PUBLICATIONS

Extended European Search Report dated Oct. 30, 2019 for Application No. 19168991.8.

*Primary Examiner* — Alvaro E Fortich
(74) *Attorney, Agent, or Firm* — Schmeiser, Olsen & Watts, LLP (57) ABSTRACT

Provided is a voltage measuring device for a battery cell of a vehicle capable of reducing the number of auxiliary parts and improving assemblability by collecting a negative voltage and a positive voltage of a battery cell, which are respectively measured by a pair of voltage measurement connection parts, at a voltage transmission connector through an electrical connection part. The voltage measuring device for a battery cell of a vehicle includes a pair of voltage measurement connection parts configured to measure a voltage of a battery cell by being respectively connected to a negative electrode and a positive electrode of the battery cell, an electrical connection part provided between (Continued)

the pair of voltage measurement connection parts and configured to connect the pair of voltage measurement connection parts to be electrically connectable with each other.

3 Claims, 6 Drawing Sheets

(56) References Cited

U.S. PATENT DOCUMENTS

| | | | | |
|---|---|---|---|---|
| 2014/0225622 A1* | 8/2014 | Kudo | ........................ | B60L 7/14 |
| | | | | 324/433 |
| 2015/0130471 A1* | 5/2015 | Bolduc | .............. | G01R 31/3835 |
| | | | | 324/427 |
| 2016/0197330 A1* | 7/2016 | Takase | .................. | B60R 16/033 |
| | | | | 429/92 |
| 2019/0074632 A1* | 3/2019 | Okamoto | ................ | B60L 58/10 |

* cited by examiner

VOLTAGE MEASURING DEVICE FOR BATTERY CELL OF VEHICLE

CROSS-REFERENCE TO RELATED APPLICATION

This application claims priority to and the benefit of Korean Patent Application No. 2018-0047593, filed on Apr. 24, 2018, the disclosure of which is incorporated herein by reference in its entirety.

FIELD OF TECHNOLOGY

The following relates to a voltage measuring device for a battery cell of a vehicle, and more particularly, to a voltage measuring device for a battery cell of a vehicle capable of reducing the number of auxiliary parts and improving assemblability by collecting a negative voltage and a positive voltage of a battery cell, which are respectively measured by a pair of voltage measurement connection parts, at a voltage transmission connector through an electrical connection part.

BACKGROUND

Generally, a battery used in an electric vehicle is composed of a plurality of battery modules so as to supply as much electric power as necessary. The battery module includes a plurality of battery cells. When the battery cells are connected in series, a relatively large electric power can be supplied.

Since the battery module generates a high voltage, a temperature of the battery cells may rise during the process, and a voltage of some of the battery cells may drop during use, so it is important to monitor states of the battery cells.

However, in a conventional sensing device for detecting states of battery cells, since a plurality of battery cells are alternately disposed in the battery module, connectors and wires for sensing are separately provided on both sides of the battery module such that there is a problem in that an overall structure is complicated.

That is, since some of the battery cells are connected to the outside through the connector provided at one side of the battery module, and the remaining battery cells are connected to the outside through the connector provided at the other side of the battery module, a structure is complicated such that installation is very difficult and working hours increase. Further, since wires and busbars should be manually connected to the battery cells, there is a problem in that the number of work process increases.

Therefore, there is a need to ameliorate such problems.

SUMMARY

An aspect relates to a voltage measuring device for a battery cell of a vehicle, and more particularly, to a voltage measuring device for a battery cell of a vehicle capable of reducing the number of additional parts and improving assemblability by collecting a negative voltage and a positive voltage of a battery cell, which are respectively measured by a pair of voltage measurement connection parts, at a voltage transmission connector through an electrical connection part.

According to an aspect of embodiments of the present invention, there is provided a voltage measuring device for a battery cell of a vehicle, which includes a pair of voltage measurement connection parts configured to measure a voltage of a battery cell by being respectively connected to a negative electrode and a positive electrode of the battery cell, an electrical connection part provided between the pair of voltage measurement connection parts and configured to connect the pair of voltage measurement connection parts to be electrically connectable with each other, and a voltage transmission connector provided at one of the pair of voltage measurement connection parts and configured to guide the voltage of the battery cell to be transmitted to the outside.

Each of the pair of voltage measurement connection parts may include a body having a circuit formed therein, a connection terminal provided in the body and connected to the battery cell, and a connection connector provided in the body and connected to the electrical connection part.

The circuit may include an electrical conducting pattern formed in the body by laser direct structuring (LDS).

A printed circuit formed on one of the pair of voltage measurement connection parts may be formed in a pattern in which each of the connection terminal and the connection connector is electrically connected to the voltage transmission connector, and a printed circuit formed on the other one of the pair of voltage measurement connection parts may be formed in a pattern in which the connection terminal and the connection connector are electrically connected with each other.

The electrical connection part may include an electrical connection member configured to allow the pair of voltage measurement connection parts to be electrically connected with each other, a cover member configured to supportably cover the electrical connection member, and a hinge coupler configured to hinge connect the cover member to the pair of voltage measurement connection parts to guide the voltage measurement connection part in a rotatable manner.

The hinge coupler may include a first coupler provided in each of the pair of voltage measurement connection parts, and a second coupler provided on the cover member to be hinge-coupled to the first coupler.

BRIEF DESCRIPTION

Some of the embodiments will be described in detail, with references to the following Figures, wherein like designations denote like members, wherein.

DETAILED DESCRIPTION

Hereinafter, a voltage measuring device for a battery cell of a vehicle according to embodiments of the present invention will be described with reference to the accompanying drawings.

In the following description, thicknesses of lines and sizes of components shown in the drawings may be exaggerated for clarity and convenience of description. In addition, the terms described below are defined in consideration of the functions of embodiments of the present invention, and these terms may be varied according to the intent or custom of a user or an operator. Therefore, the definitions of the terms used herein should be based on the content disclosed herein.

Figure 1:
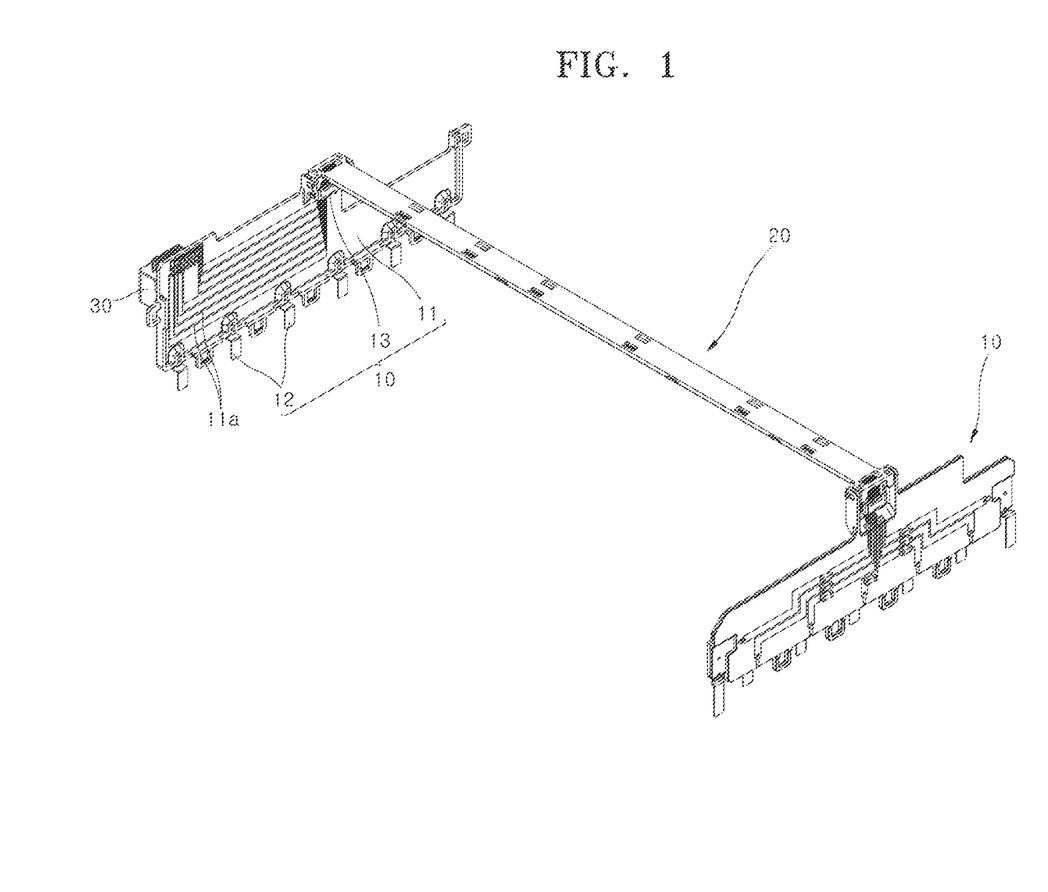
FIG. 1 is a perspective view of a voltage measuring device for a battery cell of a vehicle according to embodiments of the present invention.
Figure 2:
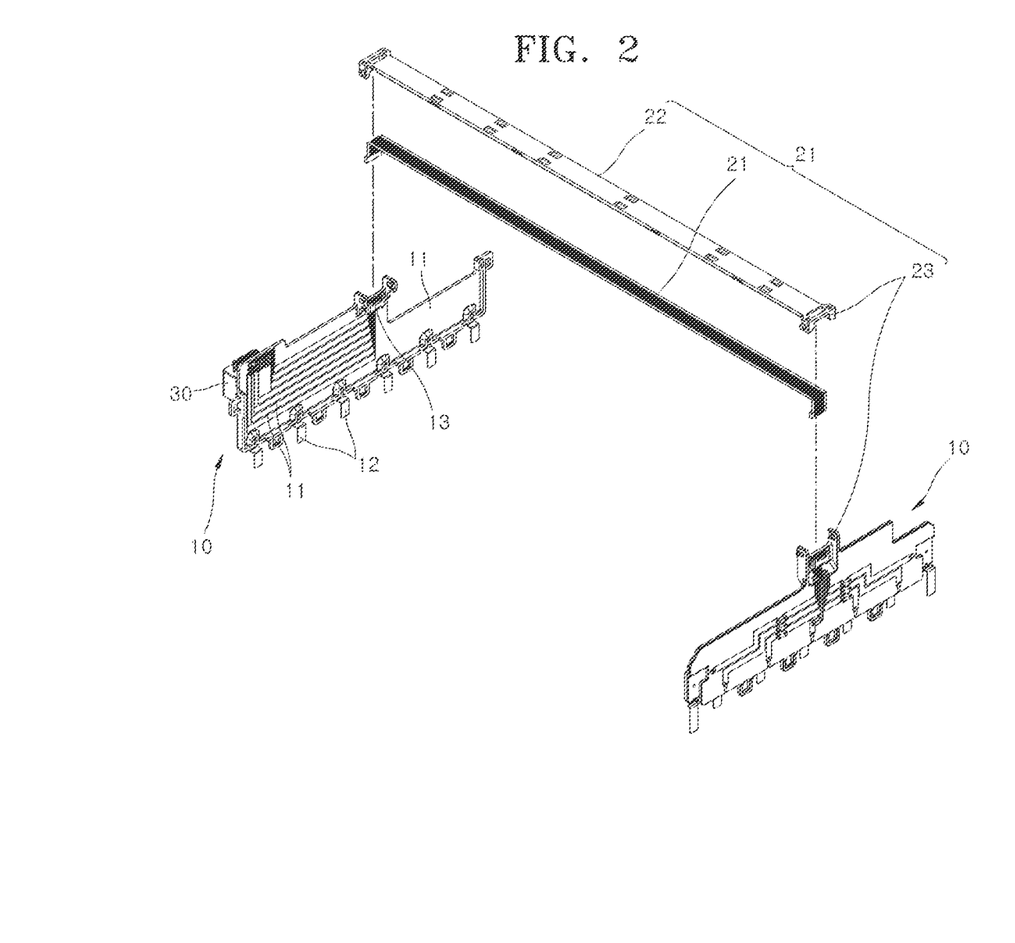
FIG. 2 is an exploded perspective view of the voltage measuring device for a battery cell of a vehicle according to embodiments of the present invention.
Figure 3:
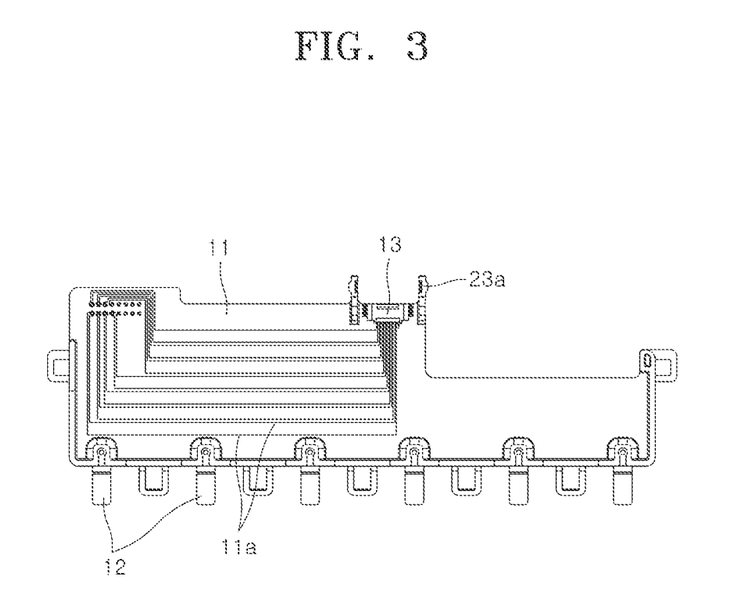
FIG. 3 is a first view of a configurational diagram illustrating one circuit of a pair of voltage measurement connection parts in the voltage measuring device for a battery cell of a vehicle according to embodiments of the present invention.
Figure 3A:
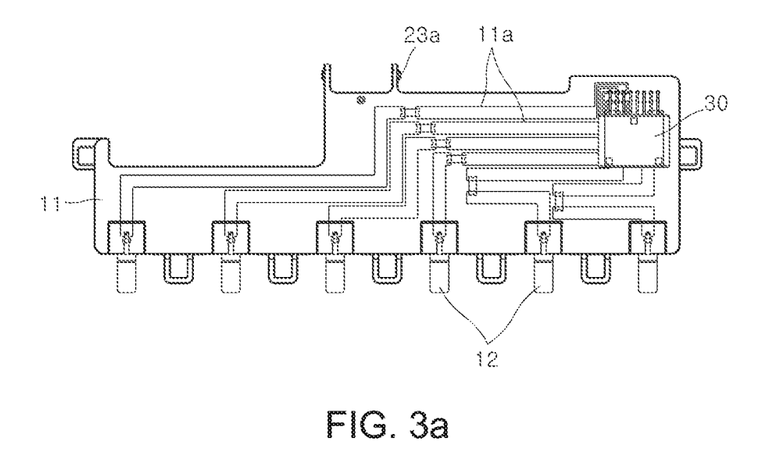
FIG. 3a is a second view of a configurational diagram illustrating one circuit of a pair of voltage measurement connection parts in the voltage measuring device for a battery cell of a vehicle according to embodiments of the present invention.
Figure 4:
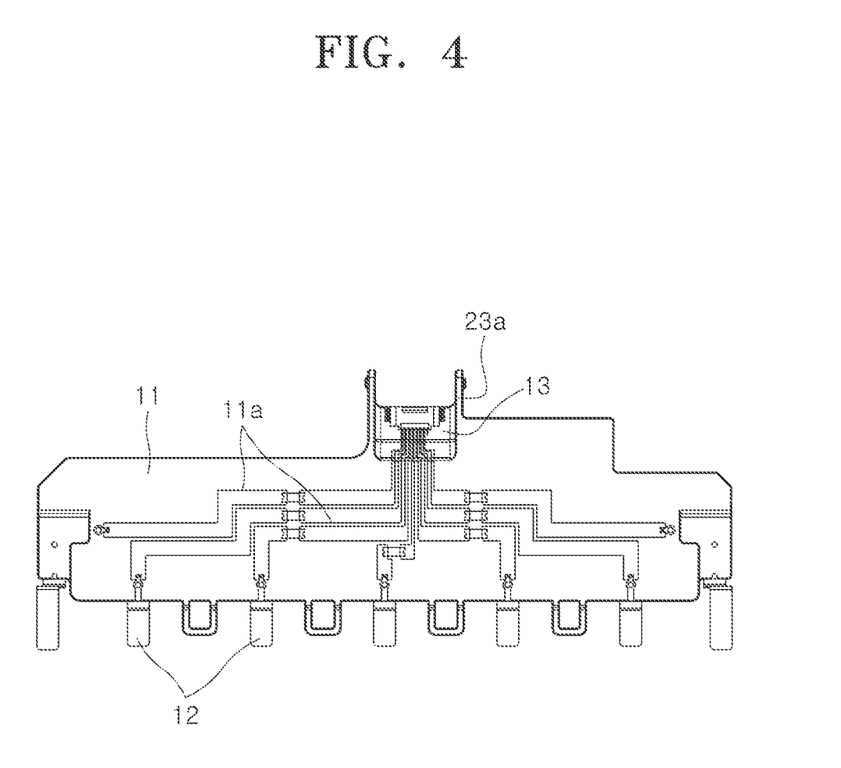
FIG. 4 is a configurational diagram illustrating the other circuit of the pair of voltage measurement connection parts in the voltage measuring device for a battery cell of a vehicle according to embodiments of the present invention.
Figure 5:
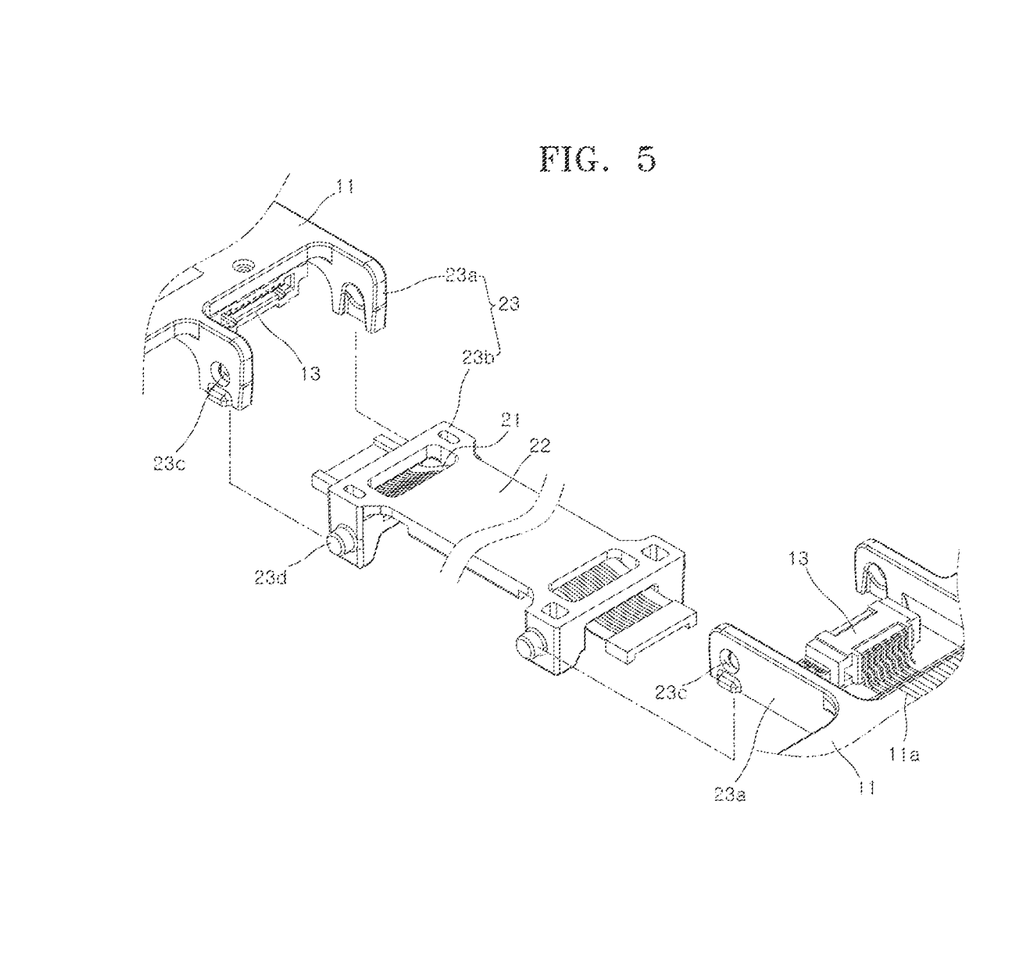
FIG. 5 is a perspective view of a hinge coupler in the voltage measuring device for a battery cell of a vehicle according to embodiments of the present invention.
Figure 6:
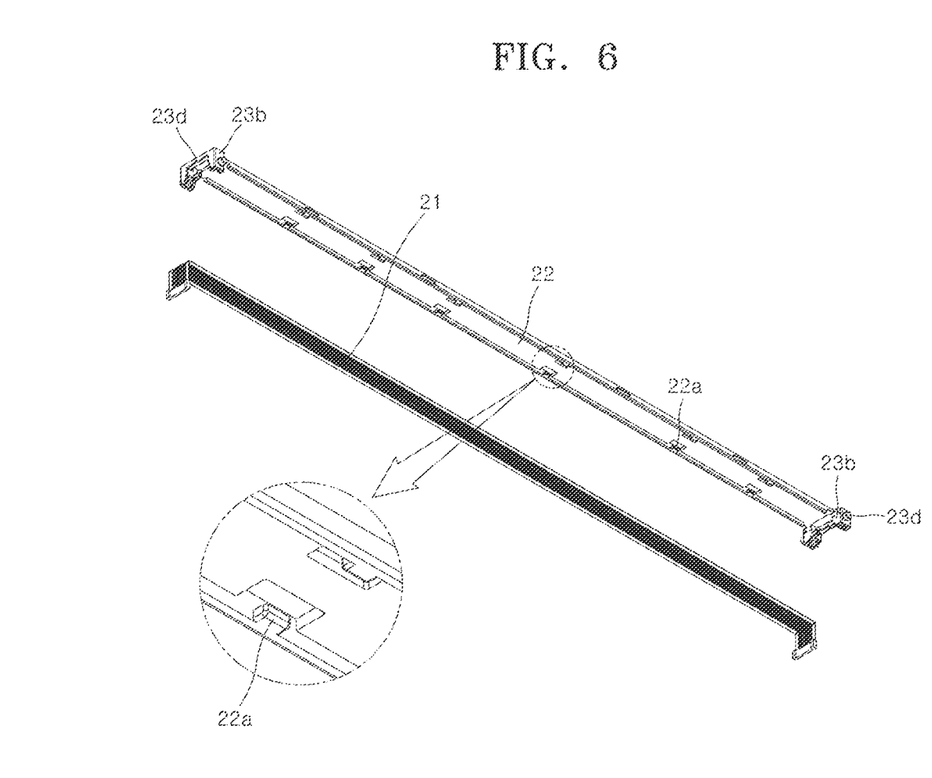
FIG. 6 is a bottom perspective view of a flat cable and a cover member in the voltage measuring device for a battery cell of a vehicle according to embodiments of the present invention.

FIG. 1 is a perspective view of a voltage measuring device for a battery cell of a vehicle according to embodiments of the present invention, FIG. 2 is an exploded perspective view of the voltage measuring device for a battery cell of a vehicle according to embodiments of the present invention, FIGS. 3 and 3a are configurational diagrams illustrating one circuit of a pair of voltage measurement connection parts in the voltage measuring device for a battery cell of a vehicle according to embodiments of the present invention, FIG. 4 is a configurational diagram illustrating the other circuit of the pair of voltage measurement connection parts in the voltage measuring device for a battery cell of a vehicle according to embodiments of the present invention, FIG. 5 is a perspective view of a hinge coupler in the voltage measuring device for a battery cell of a vehicle according to embodiments of the present invention, and FIG. 6 is a bottom perspective view of a flat cable and a cover member in the voltage measuring device for a battery cell of a vehicle according to embodiments of the present invention.

The voltage measuring device for a battery cell of a vehicle according to embodiments of the present invention includes a pair of voltage measurement connection parts 10, an electrical connection part 20, and a voltage transmission connector 30.

The pair of voltage measurement connection parts 10 are respectively connected to a negative electrode and a positive electrode of a battery cell so as to measure a voltage of the battery cell. The pair of voltage measurement connection parts 10 are connected to be electrically connected with each other by the electrical connection part 20 in a state of being spaced apart from each other. The pair of voltage measurement connection parts 10 transmit a measured voltage of the battery cell to the voltage transmission connector 30.

Specifically, each of the pair of voltage measurement connection parts 10 includes a body 11, a connection terminal 12, and a connection connector 13.

The body 11 includes a circuit 11a and is formed of a synthetic resin material by injection molding. The body 11 serves to provide a space in which the connection terminal 12 and the connection connector 13 are installed.

In this case, the circuit 11a is an electrical conducting pattern formed by laser direct structuring (LDS). Accordingly, since the body 11 itself constitutes the circuit 11a, a wire and a printed circuit board (PCB) substrate for allowing the connection terminal 12 and the connection connector 13 to be electrically connected with each other are not required. Consequently, not only the number of auxiliary parts can be reduced to reduce installation costs but also it is possible to eliminate the probability of an assembly defect due to incorrect assembling and missing parts.

Further, a circuit 11a formed in one body 11 of the pair of voltage measurement connection parts 10 is formed in a pattern for allowing each of the connection terminal 12 and the connection connector 13 to be electrically connected to the voltage transmission connector 30. A circuit 11a formed in the other body 11 of the pair of voltage measurement connection parts 10 is formed in a pattern for allowing the connection terminal 12 and the connection connector 13 to be electrically connected with each other.

Consequently, the pair of voltage measurement connection parts 10 may transmit a measured negative voltage and a measured positive voltage of the battery cell so as to allow the voltage transmission connector 30 to collect the measured negative voltage and the measured positive voltage.

Further, the connection terminal 12 is provided in the body 11 so as to be electrically connected to the circuit 11a and connected to the battery cell.

The connection connector 13 is provided in the body 11 so as to be electrically connected to the circuit 11a and connected to the electrical connection part 20.

The connection connector 13 is connected to the electrical connection part 20 so as to transmit the measured negative voltage and the measured positive voltage of the battery cell, which are measured in the pair of voltage measurement connection parts 10, to the voltage transmission connector 30.

Meanwhile, the electrical connection part 20 is provided between the pair of voltage measurement connection parts 10 to connect the pair of voltage measurement connection parts 10 to be electrically connectable with each other.

That is, the electrical connection part 20 serves to guide the voltage of the battery cell measured in a voltage measurement connection part 10, which is not provided with the voltage transmission connector 30, of the pair of voltage measurement connection parts 10, to be transmitted to the voltage transmission connector 30.

In this case, the electrical connection part 20 includes an electrical connection member 21, a cover member 22, and a hinge coupler 23.

The electrical connection member 21 is formed in a flexible strip shape and allows the pair of voltage measurement connection parts 10 to electrically conduct. In this case, the electrical connection member 21 may be made of any one of a flat cable connected to the connection connector 13 and a flexible printed circuit board (FPCB) directly connected to the circuit 11a.

Specifically, both ends of the electrical connection member 21 are connected to the connection connectors 13 provided in the pair of voltage measurement connection parts 10, and the electrical connection member 21 guides the voltage of the battery cell measured in the voltage measurement connection part 10 not provided with the voltage transmission connector 30 to be transmitted to the voltage transmission connector 30 through the circuit 11a of the voltage measurement connection part 10 provided with the voltage transmission connector 30.

When the electrical connection member 21 is flat cable, the cover member 22 supportably covers a flat cable so as to allow both ends of the flat cable to protrude.

The cover member 22 not only serves to interconnect the pair of voltage measurement connection parts 10 through the hinge coupler 23, but also protects the flat cable from the outside by preventing the exposure of the flat cable. In this case, a support protrusion 22a for supporting the flat cable is formed to protrude from an inner side of the cover member 22 to prevent the flat cable from sagging.

Further, the hinge coupler 23 hinge-connects the cover member 22 to the body 11 of the voltage measurement connection part 10, thereby guiding the body 11 in a rotatable manner.

Specifically, the hinge coupler 23 includes a first coupler 23a and a second coupler 23b. Here, the first coupler 23a is provided in each of the pair of voltage measurement connection parts 10, and the second coupler 23b is provided in the cover member 22 to be hinge-coupled to the first coupler 23a.

A coupling hole 23c is formed in one of the first coupler 23a and the second coupler 23b, and a coupling protrusion 23d is formed in the other one of the second coupler 23b and the first coupler 23a.

The voltage transmission connector 30 is provided at one of the pair of voltage measurement connection parts 10 to guide the voltage of the battery cell to be transmitted to the outside. That is, when a separate cable is connected, the voltage transmission connector 30 is configured to assist in transmitting the voltage of the battery cell measured in the voltage measurement connection part 10 to the outside.

A voltage measuring device for a battery cell of a vehicle according to embodiments of the present invention has a structure in which a negative voltage and a positive voltage of a battery cell, which are respectively measured by a pair of voltage measurement connection parts, are transmitted and collected at a voltage transmission connector through an electrical connection part. Consequently, not only the number of auxiliary parts can be reduced to reduce installation costs but also an assembly defect due to incorrect assembling and missing parts can be prevented such that there is an effect of improving assemblability.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

What is claimed is:

1. A voltage measuring device for a battery cell of a vehicle, comprising:
    a pair of voltage measurement connection parts configured to measure a voltage of the battery cell by being respectively connected to a negative electrode and a positive electrode of the battery cell;
    an electrical connection part provided between the pair of voltage measurement connection parts and configured to connect the pair of voltage measurement connection parts to be electrically connectable with each other; and
    a voltage transmission connector provided at one of the pair of voltage measurement connection parts and configured to guide the voltage of the battery cell to be transmitted to the outside;
    wherein each of the pair of voltage measurement connection parts includes: a body having a circuit formed therein; a connection terminal provided in the body and connected to the battery cell; and a connection connector provided in the body and connected to the electrical connection part;
    wherein the electrical connection part includes: an electrical connection member configured to allow the pair of voltage measurement connection parts to be electrically connected with each other; a cover member configured to supportably cover the electrical connection member; and a hinge coupler configured to hinge connect the cover member to the pair of voltage measurement connection parts to guide the voltage measurement connection part in a rotatable manner;
    wherein the hinge coupler includes: a first coupler provided in each of the pair of voltage measurement connection parts; and a second coupler provided on the cover member to be hinge-coupled to the first coupler;
    wherein a coupling hole is formed in one of the first coupler and the second coupler, and a coupling protrusion is formed in the other one of the second coupler and the first coupler;
        wherein a support protrusion for supporting the flat cable is formed to protrude from an inner side of the cover member to prevent the flat cable from sagging.

2. The voltage measuring device of claim 1, wherein the circuit includes an electrical conducting pattern formed in the body by laser direct structuring (LDS).

3. The voltage measuring device of claim 1, wherein:
    a first printed circuit formed on one of the pair of voltage measurement connection parts is formed in a first pattern in which each of the connection terminal and the connection connector is electrically connected to the voltage transmission connector; and
    a second printed circuit formed on the other one of the pair of voltage measurement connection parts is formed in a second pattern in which the connection terminal and the connection connector are electrically connected with each other.

* * * * *